United States Patent
Khlat

(10) Patent No.: US 7,039,438 B2
(45) Date of Patent: May 2, 2006

(54) MULTI-MODE RADIO COMMUNICATIONS DEVICE USING A COMMON REFERENCE OSCILLATOR

(75) Inventor: Nadim Khlat, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 491 days.

(21) Appl. No.: 10/433,369

(22) PCT Filed: Sep. 18, 2001

(86) PCT No.: PCT/EP01/10896

§ 371 (c)(1),
(2), (4) Date: Jun. 3, 2003

(87) PCT Pub. No.: WO02/47247

PCT Pub. Date: Jun. 13, 2002

(65) Prior Publication Data
US 2004/0037379 A1    Feb. 26, 2004

(30) Foreign Application Priority Data
Dec. 7, 2000    (EP) ................................ 00403441

(51) Int. Cl.
*H04M 1/00*    (2006.01)

(52) U.S. Cl. ................ 455/552.1; 455/101; 455/180.3; 455/260

(58) Field of Classification Search ........ 455/101–103, 455/142, 180.3, 256, 258, 260, 265, 552.1, 455/553.1
See application file for complete search history.

(56) References Cited

U.S. PATENT DOCUMENTS

| 5,436,937 A | * | 7/1995 | Brown et al. ................ 375/376 |
| 5,943,613 A | * | 8/1999 | Wendelrup et al. ....... 455/343.1 |
| 6,542,727 B1 | * | 4/2003 | Kikuchi ..................... 340/7.33 |

FOREIGN PATENT DOCUMENTS

| EP | 0729238 A2 | 8/1996 |
| WO | WO98/21819 | 6/2002 |

OTHER PUBLICATIONS

PCT International Search Report.

* cited by examiner

*Primary Examiner*—Duc Nguyen
*Assistant Examiner*—Janelle N. Young

(57) ABSTRACT

A multi-mode radio communications device 100 provides simultaneous timebase monitoring for GSM/TDMA/EDGE using Accumulator Type 'Layer 1' timers (150) to avoid the need for one or more secondary reference phase lock loops (PLLs). The use of such timers allows achievement by only digital means of GSM and TDMA synchronization requirements without using additional dedicated reference PLLs, as well as saving multiple integrated circuit (IC) pins and several external components. Also, through the use of such timers, no real time software adjustment is required.

This provides the following further advantages: support of simultaneous multi-mode; low part count and cost savings; fast recovery from DEEP SLEEP MODE due to the settling time of the crystals only; and simplification of multi-mode DEEP SLEEP MODE since only one single crystal clock frequency relation needs to be tracked rather various clocks frequencies; and simplification of digital signal processing by allowing sharing of the same hardware resources for all modes since those hardware resources are clocked with one clock source derived from one reference clock with maintained synchronization.

8 Claims, 3 Drawing Sheets

MULTI-MODE RADIO COMMUNICATIONS DEVICE USING A COMMON REFERENCE OSCILLATOR

FIELD OF THE INVENTION

This invention relates to multi-mode radio communications devices, i.e., which can operate in one of a number of different modes such as so-called third generation (3G) radios that may operate in Universal Mobile Telecommunications System (UMTS) and General System for Mobile Communications (GSM) modes, or GSM and Enhanced Digital GSM Equipment (EDGE) and Time Division Multiple Access (TDMA) modes.

BACKGROUND OF THE INVENTION

In the field of this invention it is known for a multi-mode radio to use two or three different crystals, each chosen to reflect a different mode's operating frequency, which are switched when changing from one operating mode (MA) to another. Such an approach has the advantage that it allows simultaneous multi-mode operation.

However, this approach has the disadvantages that it is not cost effective since it requires a number of different crystals (which are typically very costly, depending on the required accuracy of operating frequency), each of which needs automatic frequency control (AFC), further increasing cost and circuit size.

Also, fast handover between MA's, (for example, GSM to WBCDMA, or WBCDMA to GSM, or GSM to EDGE, or EDGE to WBCDMA) requires that timebase synchronization be maintained between different base stations using different MA's, with 'deep sleep' mode (power on and off) capabilities.

International Patent Application No. WO-A1-9821819 (Nokia) describes a frequency generator for use in a mobile communication device. The frequency generator is capable of generating different frequencies for several different modes.

Different frequencies are generated by a common reference frequency oscillator. Luteger division's performed so as to yield a variety of different output frequencies.

There is therefore a need to provide a multi-mode radio communications device using a shared clock source wherein the abovementioned disadvantage(s) may be alleviated.

STATEMENT OF INVENTION

In accordance with a first aspect of the present invention there is provided a multi-mode radio communications device using a shared clock source as claimed in claim 1.

In accordance with a second aspect of the present invention there is provided an integrated circuit for use in a multi-mode radio communications device using a shared clock source as claimed in claim 7.

Briefly stated, in a preferred implementation the present invention implements simultaneous timebase monitoring for GSM/TDMA/EDGE using Accumulator Type of 'Layer 1' timers to avoid the need for one or more secondary reference phase lock loops (PLLs). The use of Accumulator Layer 1 timers allows achievement by only digital means of the same requirements that are specified in the GSM synchronization specifications (GSM 5.10) and TDMA synchronisation requirements without using additional dedicated reference PLLs, as well as saving multiple integrated circuit (IC) pins and several external components. Also, through the use of Accumulator Layer 1 timers, no real time software adjustment is required.

BRIEF DESCRIPTION OF THE DRAWINGS

One multi-mode radio communications device using a shared clock source incorporating the present invention will now be described, by way of example only, with reference to the accompanying drawings, in which.

DESCRIPTION OF PREFERRED EMBODIMENTS

Briefly stated, in a preferred implementation the present invention implements simultaneous timebase monitoring for GSM/TDMA/EDGE using Accumulator Type 'Layer 1' timers to avoid the need for one or more secondary reference phase lock loops (PLLs). The use of Accumulator Layer 1 timers allows achievement by only digital means of the same requirements that are specified in the GSM synchronization specifications (GSM 5.10) and TDMA synchronisation requirements without using additional dedicated reference PLLs, as well as saving multiple integrated circuit (IC) pins and several external components. Also, through the use of Accumulator Layer 1 timers, no real time software adjustment is required.

Figure 1:
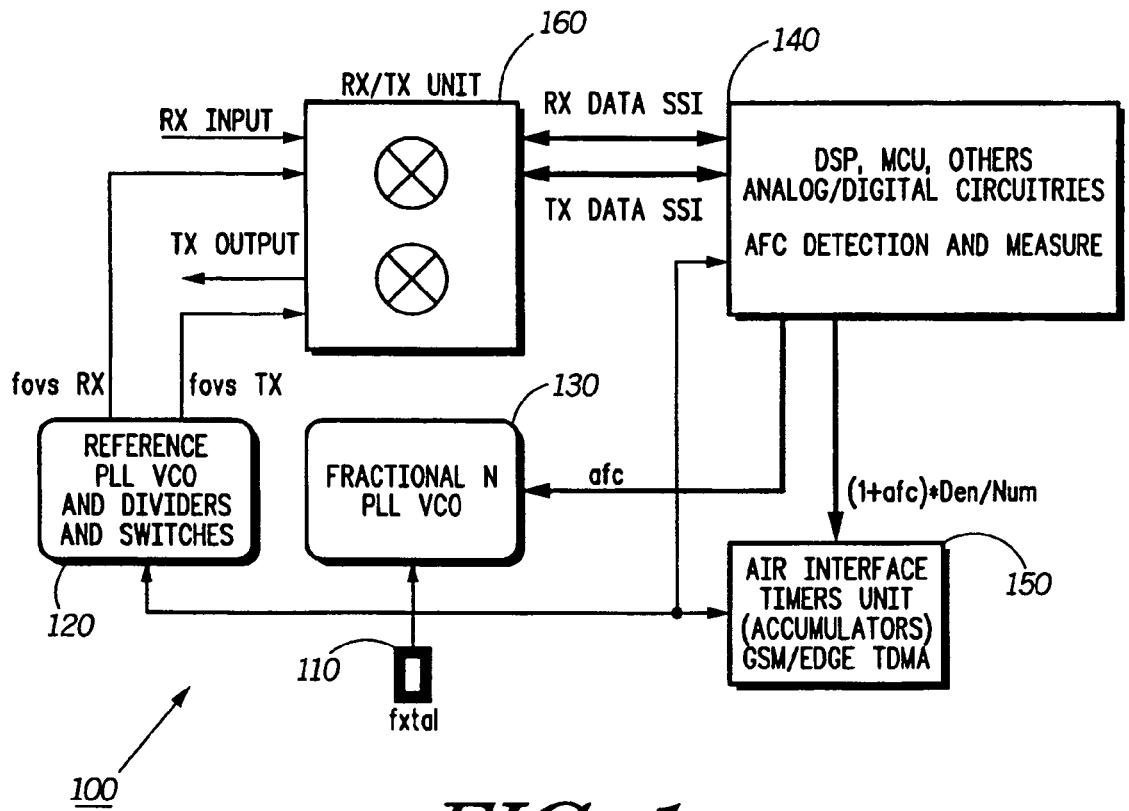
FIG. 1 shows a block schematic diagram of a multi-mode cellular radiotelephone incorporating the present invention.

As shown in FIG. 1, a multi-mode cellular radiotelephone transceiver 100 uses a shared clock source based on a single frequency crystal 110, which is coupled to drive a reference PLL section 120, a fractional N PLL section 130, an analog/digital control section 140 (including automatic frequency control—afc—detection and measurement), and an air interface timer section 150 (as will be explained in greater detail below) providing respective accumulator-type 'Layer 1' timers for use in the device's respective operating modes. The multi-mode radio communications device 100 also has a RX/TX section 160, which receives reception/transmission frequency signals fovs_RX/fovs_TX from the reference PLL section 120, and also receives a signal output from the fractional N PLL section 130. The RX/TX section 160 also exchanges receive/transmit data signals RXDataSSI/TXDataSSI with the control section 140, which provides a frequency correction signal afc to the fractional N PLL section 130, and also provides (as will be explained in greater detail below) respective frequency correction signals (1+afc)*Den/Num to the air interface timers in the air interface timer section 150.

Air Protocol Timer Unit

Figure 2:
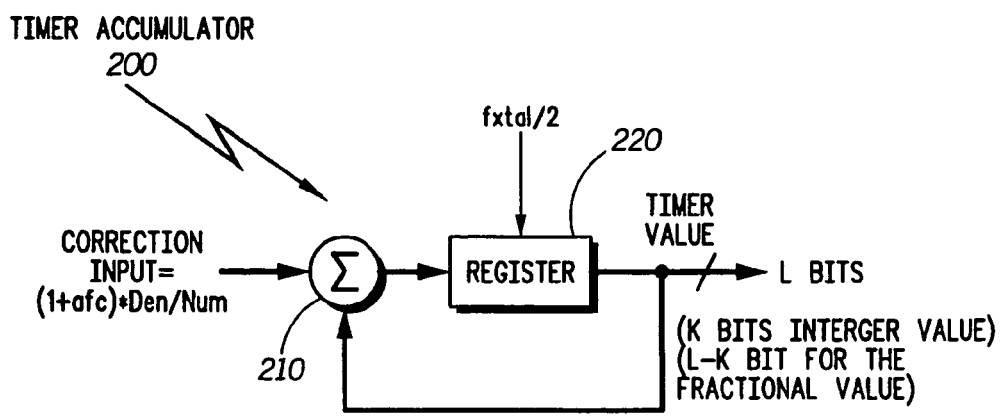
FIG. 2 shows a schematic diagram of one air protocol timer unit of the multi-mode radio device of FIG. 1.

Referring now also to FIG. 2, in the air interface timer section 150, each accumulator-type 'Layer 1' timer 200 comprises a summation element 210 and a register 220. The register 220 is driven at the crystal frequency fxtal/2, and the summation element 210 sums the output of the register 220 and a correction value (1+afc)Den/Num from the control section 140 of FIG. 1. The output of the register 220 thus comprises an L-bit value, of which K bits represent an integer value and L-K bits represent a fractional value.

Thus it will be appreciated that each timer 200 performs the function:

TimerValue($n$)=TimerValue($n$−1)+(1+*afc*)DenNum where afc is the frequency correction value that could be either positive or negative, n is the index time for each clock period of the crystal frequency fxtal/2 and Den/Num is the ratio between the clock frequency required for the timer's operating mode and the clock frequency provided by the crystal (e.g., TDMA frequency and GSM frequency, i.e., Den/Num=19.44 Mhz/13 Mhz=486/325).

Considering case 1, in which the Layer 1 timer is used for the GSM timebase, then Num=Den=1.

Supposing afc=0, i.e., there is no crystal frequency error, then the Timer Value will start at 0,1,2,3,4, . . . so its value corresponds to the number of clock periods of fxtal/2.

Supposing afc>0, with a crystal frequency error of (say) −20%, i.e., afc=+1/5, then the timer value will start at 0, 1.2, 2.4, 3.6, 4.8, 6, 7.2, . . . such that the timer has already been corrected by the value afc. The timer register value thus corresponds to the Air Protocol timing value. This register value will contain a non-fractional Number over K bits and a fractional Number over L-K bits. In this case the timer resolution is thus equal to afc/fxtal/2, and the timer accuracy is 2/fxtal.

Considering case 2, in which the Layer 1 timer used for the TDMA timebase, then also it is possible to input a correction value Den/Num(1+*afc*)=19.44 Mhz/13 Mhz=486/325*(1+ *afc*)

to count how many clock periods and fraction thereof at 19.44 Mhz elapsed using the 13 Mhz clock.

Figure 3:
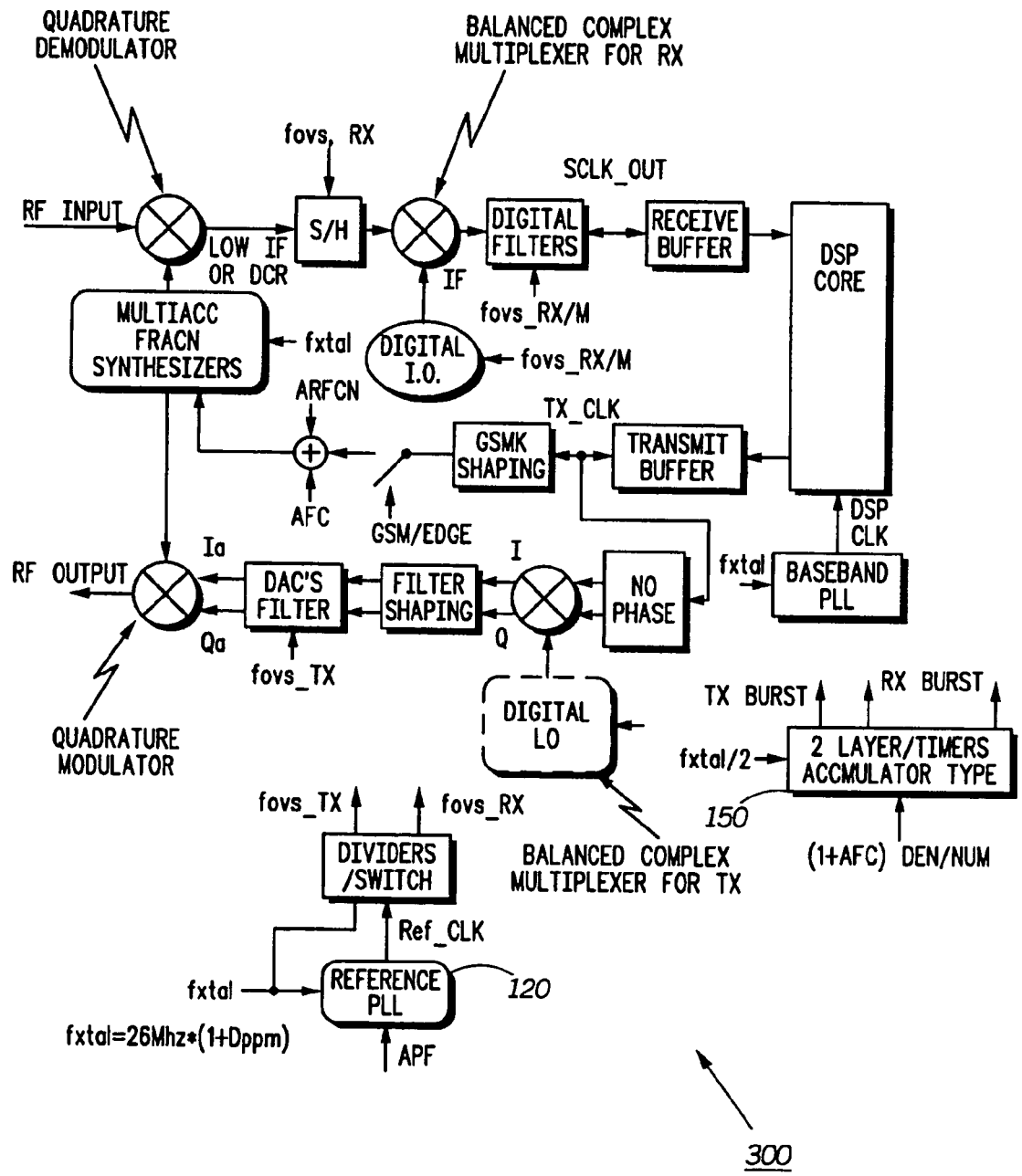
FIG. 3 shows a block schematic diagram illustrating a clock distribution 'tree' and digital AFC correction for simultaneous monitoring in the multi-mode radio device of FIG. 1 operating in GSM/TDMA/EDGE modes.

In FIG. 3 is shown a radio 'clock tree' 300 for muli-mode GSM/TDMA/EDGE modes.

Two accumulator-type 'Layer 1' timers as shown in FIG. 2 are used to count the timebase related to the different respective modes. Each Layer 1 timer accumulator is clocked by a 26 Mhz crystal clock (as an example) and operates as described above.

It will be understood that even though in this way the timebase (Tb) is calculated with an accuracy of 0.2 ppm, the Layer 1 timers are trigerred only at the rising or falling edge of 2*Txtal (Txtal being the transmit frequency derived from the crystal frequency fetal), so the timing signals rise or fall within an accuracy of 2*Txtal (=Tb/24 if Txtal=1/13MHz) which is much less than the required accuracy of Tb/4 as specified for GSM.

It will be appreciated that in the above embodiment with two accumulator type 'Layer 1' timers used for respectively GSM and TDMA modes, the two timers use directly the crystal clock without the need to have a settling time of a second reference PLL (if it is turned on or off during 'Deep Sleep' mode). However, it will further be appreciated that in order to receive or transmit a TDMA burst, the first reference PLL that is used to derive a 19.44 Mhz from a 26 Mhz crystal needs to settle since it is used to derive the oversampling clock required in the RX and TX sections of the transceiver.

As mentioned above, the multi-mode cellular radiotelephone transceiver 100 makes use of a direct fractional N synthesizer (130) that has a high value of fractionalization by using, for example, a 24 bit multiaccumulator in order to achieve digital fine tuning AFC correction for the RX and TX VCO's (3 Hz in DCS—Data Coding Scheme—band, for example).

Although the MS (mobile station, i.e., the multi-mode cellular radiotelephone transceiver 100) carrier frequency is accurate to within 0.1 ppm by applying digital AFC on the fractional N (section 6.1 in GSM 5.10) PLL section 130 as described above, the GSM (and EDGE) specs require also that the MS keep its internal timebase in line with the signals received from the BTS (base transceiver station) to an accuracy of Tb/4 where Tb is the symbol bit period. Also, during a temporary total loss of signal, of up of 64 SACCH (Slow Associated Control Channel) block periods, the MS must update its timebase with a clock which is accurate to within 0.2 ppm.

This implies that the baseband IC should be able to keep its internal timebase (Layer 1 Timers) in line with signals received from a BTS with an accuracy of Tb/4. Apart from the Layer 1 timers that generate the timing-like RX or TX bursts windows, nothing else requires an AFC correction.

For example, in the control section 140, the DSP clock generated from the baseband PLL doesn't require an accuracy related to AFC since it is used for calculation speed. Although the RX and TX SSI interface uses a clock to synchronize the data transfer from the transceiver IC to the Baseband IC, this clock is derived from the fovs_RX and fovs_TX clock. However, the data transferred is triggered by the layer 1 timers system through RX_ACQ and DMCS. These signals then will enable the clock transmission.

On the RX side, the DSP will measure the frequency error of the receiver using Frequency Correction Burst method for GSM or other methods for TDMA, and then will provide an AFC value to the RX main synthesizer to compensate the frequency shift.

In previous generation receivers (e.g., Superheterodyne receivers), which used high IF value (400 MHz for example), since the main LO is only AFC corrected, the IF is shifted by a frequency error to compensate the fact that the second LO is not AFC corrected. This IF shift value is equal to IF*Dppm which for high IF values could move the spectrum undesirably near to the edge of a SAW filter (e.g., 400 Mhz*20 ppm=8 Khz). This consideration also applies to a transmitter with dual up-conversion (e.g., TX IF=88 Mhz ) which leads to having a crystal that is directly corrected and tuned through a DAC such all the LOs (RX or TX ) are already AFC adjusted since the reference is corrected.

However in direct and very low IF conversion receivers/transmitters, the situation is quite different. In the receiver, the IF is very small or equal to zero so the resulting frequency shift after AFC correction is negligible (e.g., 115 KHz*20 ppm=2.3 Hz). That is why in the above embodiment fovs_RX is selected to be equal to fxtal/2=13 Mhz.

In TDMA mode, the receiver A/D and filtering requires a clock of fovs_RX=3.888 MHz=19.44 MHz/5. This clock is derived from the reference PLL.

In the transmitter side, in GSM mode, the AFC correction is added to the GMSK frequency modulation and applied to the multi-accumulator FRACN synthesizer to compensate the crystal error and to meet the 0.1 ppm RF output accuracy requirement. GSM pulse shaping operates at the frequency fovs_TX=fxtal/6=4.333 Mhz.

In the transmitter side, in EDGE mode, the AFC correction is applied to the main LO TX to maintain an output RF frequency accurate to within 0.04 ppm. Also, the I/Q modulators operate with similar fovs_TX clock=fxtal/6=4.333 Mhz. However, since the IQ generated signals are using a non-corrected crystal clock, a phase error is generated by the IQ modulators. However, this phase error is very small as explained by the following analysis:

For example, supposing that the modulator has to generate a test tone at modulation frequency $f_{modulation}$=67.7 KHz=fxtal/384. The contents of the look up ROM table that contains the necessary pulse shaping will be read with the non-corrected clock. A frequency error will appear with a value equal to fxtal*Dppm/384 (e.g., equal to 26 Mhz*20 ppm/384=1.35 Hz). It would be possible at a first thought to compensate this error through the AFC on the main LO; however, this error is non-constant and changes with the modulation. The frequency error could go up to +/−1.35 Hz, which will lead in a one-timeslot TX of 577 μs to a peak phase error of +/−577 μs*1.35 Hz*360=0.28 degrees. If a two-timeslot TX is used, then the added peak phase error would be 0.56 degrees which is relatively small.

Because of EDGE-type modulation, the frequency error will not be constant. It will result in a phase type of error. For a maximum frequency deviation of 200 KHz, this will result in 0.84 degrees peak phase error in a one-timeslot TX.

Finally, AFC correction in the accumulator type Layer 1 timers is performed as described above, removing the need for any second reference PLL as mentioned above.

Figure 4:
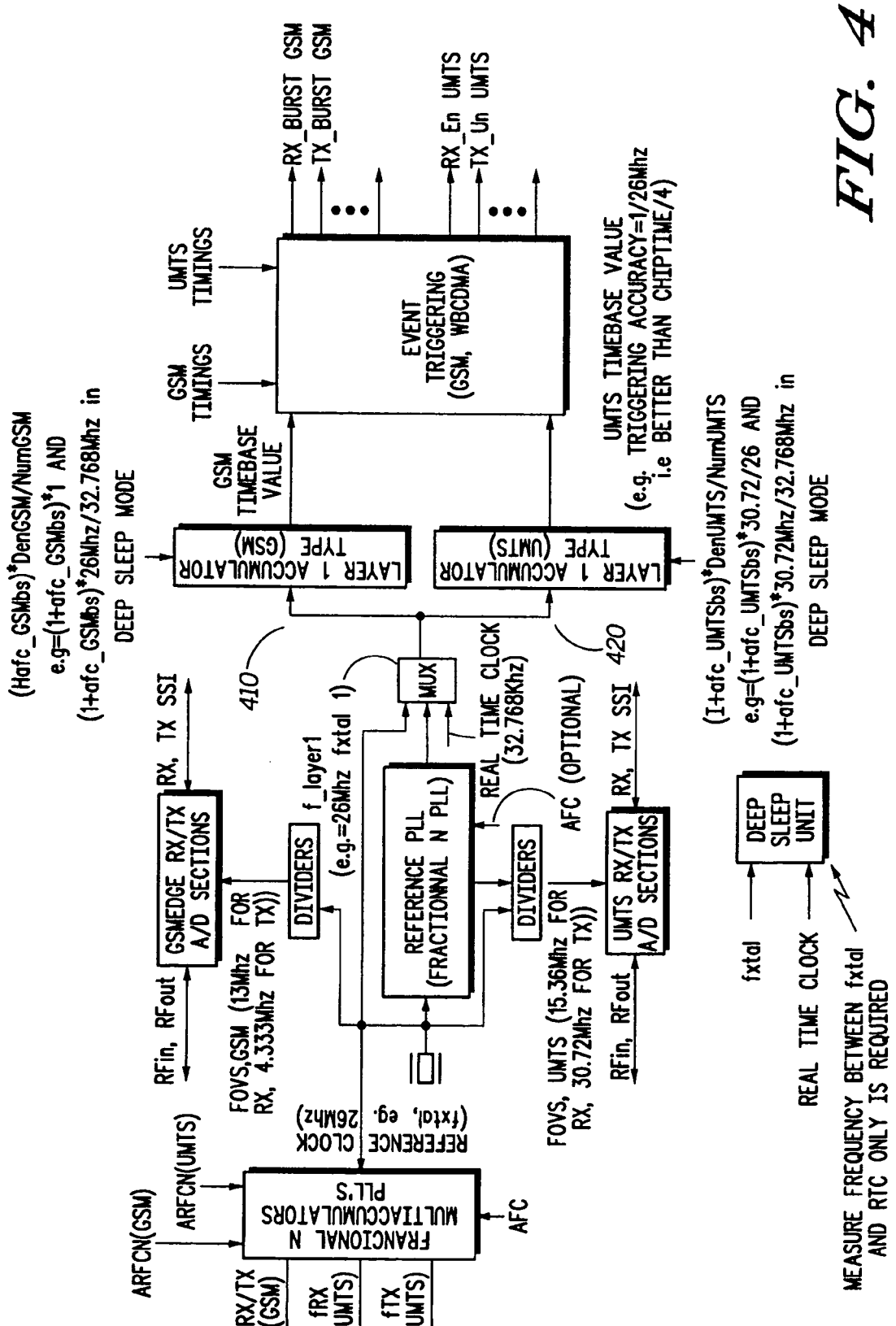
FIG. 4 shows a block schematic diagram illustrating a clock distribution 'tree' and digital AFC correction for simultaneous monitoring in the multimode radio device of FIG. 1 operating in GSM/WBCDMA modes.

In FIG. 4 is shown a radio 'clock tree' 400 for dual mode GSM and WBCDMA modes.

Two accumulator-type 'Layer 1' timers 410 and 420 as shown in FIG. 2 are used to count the timebase related to a GSM network and to a UMTS network. Each Layer 1 timer accumulator is clocked by a 26 Mhz crystal clock (this clock frequency is only an example; it could alternatively be 15.36 Mhz for a UMTS clock if additional real time processing for WBCMDA is required where no buffered memory is available to store the sampled I and Q data values). The accumulator for GSM accumulates only 1 plus the AFC error, called AFC_GSMbs, which is the crystal frequency error (or f_layer1 clock) versus a GSM Base Station reference clock; the accumulator for UMTS accumulates 1 plus the AFC error, called AFC_UMTSbs, which is the crystal frequency (or f_layer1 clock) versus a UMTS Base Station reference clock multiplied by a ratio equal to the UMTS reference clock frequency divided by the crystal frequency (or f_layer1 clock).

The accumulator timers may be arranged to be incremented with different AFC values depending on the frequency error of the MS between two or more base stations that have different reference frequency adjustments (in UMTS, the basestation specifies a frequency error between GSM and UMTS basestation of 0.05 ppm, which can result in an error of 0.1 ppm in the mobile unit, to which can also be added the Doppler frequency error between GSM and UMTS basestations due to different receive RF frequencies).

The input value to the Layer 1 accumulators can be changed when operating in Deep Sleep mode and when the f_layer1 clock is selected to be equal to the Real Time Clock source (e.g., 32.768 KHz). The input values are changed based on the frequency relation between the 32.768 KHz and the crystal clock source that is usually measured in the radio within the Deep Sleep Module. Thus, only the crystal clock frequency relative to the 32.768 KHz signal is required to be tracked over time.

It will, of course, be appreciated that the present invention and the above-described embodiment(s) lend themselves readily to use in integrated circuit form, embodied in an arrangement of one or more integrated circuits, where many of the invention's advantages assume greater significance.

It will be understood that the multi-mode radio communications device using a shared clock source described above provides the following advantages:

Support of simultaneous multi-mode operation.

Low part count and cost savings (e.g., $1.5 for a 3G UMTS radio, and external components savings).

Fast recovery from DEEP SLEEP MODE due to the settling time of the crystals only.

Simplification of the DEEP SLEEP MODE in multi-mode radios since the crystal clock can be switched off and the RTC clock (e.g., at 32 KHz) can be used as the timebase, requiring only 32 KHz versus one single crystal clock frequency relation to be tracked rather various clock frequencies.

Simplification of digital signal processing by allowing sharing of the same hardware resources (DSP, memory, Microcontroller, etc. . . . ) for all modes since those hardware resources are clocked with one clock source derived from one reference clock with maintained synchronisation.

The invention claimed is:

1. A multi-mode radio communications device (100) using a shared clock source (110), comprising:
   means for coupling to a crystal (110) for deriving therefrom an AFC-controlled clock source signal;
   a reference PLL (120) for receiving the clock source signal and for deriving therefrom a different clock signal (fovs_RX,fovs_RX) to be delivered to the radio's RX section and/or TX section (160); and
   a plurality of accumulator timers (150) each for maintaining timebase synchronization in a respective one of the multi-modes, wherein each of the plurality of accumulator timers is arranged to use as its increment signal a signal derived from the AFC means and a signal ((1+afc)*Den/Num)) representative of the ratio between the clock source signal frequency and the frequency of its respective one of the multi-modes.

2. The multi-mode radio communications device of claim 1 wherein A/D or D/A sections (140) of a plurality of different ones of the multi-modes are arranged to derive their clock signals from the clock source signal or the reference PLL.

3. The multi-mode radio communication device of claim 1 or 2 wherein the accumulator timers (150) are driven by the same clock signal that is selected from:
   the clock source; or
   the reference PLL clock output; or
   a real time clock source when operating in deep sleep mode.

4. The multi-mode radio communication device of claim 3 wherein the accumulator timers are arranged to be incremented by different signals dependent on selection of the clock signal.

5. The multi-mode radio communication device of claim 1 wherein the accumulator timers (150) are arranged to be incremented with different AFC values depending on the frequency error of the radio communication device between two or more base stations that have different reference frequency adjustments.

6. The multi-mode radio communication device of claim 1 arranged to operate in a plurality of modes chosen from:
   Universal Mobile Telecommunications System (UMTS);
   General System for Mobile Communications (GSM);
   Enhanced Digital GSM Equipment (EDGE); and
   Time Division Multiple Access (TDMA).

7. An integrated circuit arrangement for use in a multi-mode radio communications device (100) using a shared clock source (110), the integrated circuit arrangement comprising:
    means for coupling to a crystal (110) for deriving therefrom an AFC-controlled clock source signal;
    a reference PLL (120) for receiving the clock source signal and for deriving therefrom a different clock signal (fovs_RX,fovs_RX) to be delivered to the radio's RX section and/or TX section (160); and
    a plurality of accumulator timers (150) each for maintaining timebase synchronization in a respective one of the multi-modes, wherein each of the plurality of accumulator timers is arranged to use as its increment signal a signal derived from the AFC means and a signal ((1+afc)*Den/Num)) representative of the ratio between the clock source signal frequency and the frequency of its respective one of the multi-modes.

8. The integrated circuit arrangement of claim 7 further comprising digital signal processing circuitry arranged to use clocks derived from a single clock source whereby multimode processing shares the same processing blocks.

* * * * *